(12) United States Patent
Hsu et al.

(10) Patent No.: US 9,599,745 B2
(45) Date of Patent: Mar. 21, 2017

(54) PACKAGE STRUCTURE OF OPTICAL APPARATUS

(71) Applicants: En-Feng Hsu, Hsin-Chu (TW); Nien-Tse Chen, Hsin-Chu (TW)

(72) Inventors: En-Feng Hsu, Hsin-Chu (TW); Nien-Tse Chen, Hsin-Chu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 315 days.

(21) Appl. No.: 13/865,640

(22) Filed: Apr. 18, 2013

(65) Prior Publication Data
US 2013/0327931 A1 Dec. 12, 2013

(30) Foreign Application Priority Data

Jun. 6, 2012 (TW) .............................. 101120195 A

(51) Int. Cl.
| | | |
|---|---|---|
| G01V 8/12 | (2006.01) | |
| G01S 17/02 | (2006.01) | |
| G01S 7/481 | (2006.01) | |
| H01L 31/0203 | (2014.01) | |
| H01L 31/0216 | (2014.01) | |

(52) U.S. Cl.
CPC .............. G01V 8/12 (2013.01); G01S 7/4813 (2013.01); G01S 17/026 (2013.01); H01L 31/0203 (2013.01); H01L 31/02162 (2013.01); H01L 2224/16225 (2013.01)

(58) Field of Classification Search
CPC .......... G01V 8/12; G01V 8/10; G01S 7/4813; G01S 7/4811; G01S 7/481; G01S 17/026; G01S 17/00; G02B 5/281; G01B 5/28; H01L 31/02162; H01L 31/02165; H01L 31/02164; H01L 31/02161; H01L 31/0216; H01L 31/0203; H01L 2224/16151; H01L 2224/16221; H01L 2224/16265

See application file for complete search history.

(56) References Cited

U.S. PATENT DOCUMENTS

| | | | |
|---|---|---|---|
| 6,740,862 B2 * | 5/2004 | Paritsky et al. ............... | 250/221 |
| 7,038,287 B2 * | 5/2006 | Kim .................. | H01L 27/14618 257/431 |
| 7,180,640 B2 * | 2/2007 | Maltseff et al. ............... | 358/474 |
| 7,233,025 B2 * | 6/2007 | Davuluri et al. ............... | 257/81 |
| 7,411,195 B2 * | 8/2008 | Narasako et al. .......... | 250/338.3 |
| 7,675,027 B2 * | 3/2010 | Cheng et al. .................. | 250/239 |
| 7,720,374 B2 * | 5/2010 | Kim .................. | H01L 27/14625 348/374 |

(Continued)

FOREIGN PATENT DOCUMENTS

| | | |
|---|---|---|
| TW | 200931977 | 7/2009 |
| TW | 201020113 A | 6/2010 |

*Primary Examiner* — John Lee
(74) *Attorney, Agent, or Firm* — Tung & Associates

(57) ABSTRACT

The present invention provides a package structure of an optical apparatus which includes a substrate, a light emitting device, a light sensing device, and a light barrier member. The light emitting device is disposed on the substrate and electrically connected to the substrate. The light emitting device is for emitting light. The light sensing device is disposed on the substrate and is a chip scale package (CSP) device. The light sensing device is for receiving light reflected by an object. The light barrier member is disposed around a periphery of the light sensing device.

9 Claims, 5 Drawing Sheets

(56) References Cited

U.S. PATENT DOCUMENTS

| | | |
|---|---|---|
| 8,362,496 B1* | 1/2013 | Tu et al. .................... 257/82 |
| 8,492,720 B2 | 7/2013 | Yao et al. |
| 8,637,949 B2* | 1/2014 | Uekawa .................... 257/434 |
| 8,697,474 B2* | 4/2014 | Greer et al. .................. 438/70 |
| 8,957,380 B2* | 2/2015 | Costello et al. .......... 250/341.8 |
| 2005/0173811 A1* | 8/2005 | Kinsman .................. 257/784 |
| 2005/0180010 A1* | 8/2005 | Mukaiyama et al. ........ 359/497 |
| 2006/0045530 A1* | 3/2006 | Lim et al. ................. 398/135 |
| 2007/0102777 A1* | 5/2007 | Davuluri et al. ............. 257/432 |
| 2008/0006762 A1* | 1/2008 | Fadell et al. ............... 250/201.1 |
| 2008/0075474 A1* | 3/2008 | Kawai ..................... 398/208 |
| 2009/0153729 A1 | 6/2009 | Hiltunen |
| 2010/0141825 A1* | 6/2010 | Kim ................. H01L 27/14618 348/340 |
| 2010/0237247 A1* | 9/2010 | Chen ...................... 250/339.05 |
| 2010/0244172 A1* | 9/2010 | Borthakur et al. ........... 257/435 |
| 2010/0258712 A1* | 10/2010 | Wiese et al. ............. 250/237 R |
| 2011/0108714 A1 | 5/2011 | Yang et al. |
| 2011/0121182 A1* | 5/2011 | Wong et al. ................. 250/340 |
| 2011/0297831 A1* | 12/2011 | Yao et al. .................. 250/338.4 |
| 2013/0267273 A1* | 10/2013 | Rudmann et al. .......... 455/556.1 |
| 2013/0327931 A1* | 12/2013 | Hsu et al. ................. 250/237 R |
| 2014/0197305 A1* | 7/2014 | Hsu et al. .................. 250/208.2 |

* cited by examiner

PACKAGE STRUCTURE OF OPTICAL APPARATUS

CROSS REFERENCE

The present invention claims priority to TW 101120195, filed on Jun. 6, 2012.

BACKGROUND OF THE INVENTION

Field of Invention

The present invention relates to a package structure; particularly, it relates to such package structure for an optical apparatus.

Description of Related Art

FIG. 1 shows a cross-sectional view of the package structure of a conventional optical proximity sensor. Please refer to FIG. 1. The conventional optical proximity sensor 100 comprises a light source 110, a light detector 120 and a package housing 130. The package housing 130 includes a first accommodating space 132 and a second accommodating space 134. The light source 110 is disposed in the first accommodating space 132. The light detector 120 is disposed in the second accommodating space 134. In this conventional optical proximity sensor 100, when an object 101 approaches the conventional optical proximity sensor 100, the light beam L1 emitted from the light source 110 is reflected by the object 101 so as to be received by the light detector 120, thus enabling the conventional optical proximity sensor 100 to judge whether the object 101 is approaching.

However, in this conventional proximity optical sensor 100, the light source 110 in the first accommodating space 132 is electrically connected to the package housing 130 via surface adhesion, but the light detector 120 in the second accommodating space 134 is electrically connected to the package housing 130 via wire bonding, as shown in FIG. 1. Thus, it is not easy to reduce the size (e.g., the width W1) of the second accommodating space 134.

In addition, the package housing 130 further comprises a shielding structure 136 that is disposed between the light source 110 and the photodetector 120. The shielding structure 136 is for preventing the light beam L1 emitted from the light source 110 from being directly received by the photodetector 120, not through reflection. However, although the employment of the shielding structure 136 may effectively restrain the traveling path of the light, it causes a negative effect that the overall volume of the conventional proximity optical sensor 100 can not be effectively reduced.

SUMMARY OF THE INVENTION

The present invention provides a package structure of an optical apparatus, which is small in size and has better optical performance.

The objectives and advantages of the present invention can be understood from the disclosure of the specification.

To achieve one or more of the above and other objectives, from one perspective, the present invention provides a package structure of an optical apparatus which comprises a substrate, a light emitting device, a light sensing device, and a light barrier member. The light emitting device is for emitting light. The light emitting device is disposed on the substrate and electrically connected to the substrate. The light sensing device is used for receiving light reflected by an object. The light sensing device is disposed on the substrate and is a chip scale package (CSP) device. The light barrier member is disposed around a periphery of the light sensing device.

In one embodiment, the light barrier member is disposed on or above the substrate and physically connected to the substrate. In one embodiment, the package structure of the optical apparatus further comprises a multilayer film which is disposed on or above the light sensing device, wherein at least a portion of the light reflected by the object passes through the multilayer film to be received by the light sensing device. In one embodiment, the portion of the light reflected by the object that passes through the multilayer film to be received by the light sensing device enters the multilayer film with an incident angle smaller than a predetermined angle.

In one embodiment, the light barrier member is physically connected to the light sensing device. The package structure of the optical apparatus further comprises a multilayer film which is disposed on or above the light sensing device, wherein at least a portion of the light reflected by the object passes through the multilayer film to be received by the light sensing device. In one embodiment, the light barrier member includes a light blocking cover disposed on or above the light sensing device and having an opening. The portion of the light reflected by the object passes through the opening to be received by the light sensing device. In one embodiment, the opening exposes a portion of the multilayer film. In one embodiment, the package structure of the optical apparatus further comprises a partition wall which is disposed on the substrate and located between the light emitting device and the light sensing device. In one embodiment, the portion of the light reflected by the object that passes through the multilayer film to be received by the light sensing device enters the multilayer film with an incident angle smaller than a predetermined angle.

In one embodiment, the light barrier member includes a light transmissive layer and a shielding layer. A side of the light transmissive layer is physically connected to the light sensing device. Another side of the transmissive layer is physically connected to the shielding layer. In one embodiment, the light transmissive layer covers an upper surface of the light sensing device. The shielding layer has an opening which exposes a portion of the light transmissive layer. The portion of the light reflected by the object passes through the opening to be received by the light sensing device.

In one embodiment, the light emitting device is a light emitting device emitting invisible light and the light sensing device is a light sensing device sensing invisible light.

In one embodiment, the light sensing device is electrically connected to the substrate via one or more conductive materials. The one or more conductive materials are located between the light sensing device and the substrate.

In one embodiment, a distance between the light emitting device and the light sensing device is in a range between 0.1 mm and 3 mm.

According to the above, the package structure of the optical apparatus of the present invention comprises a light sensing device which is a chip scale package (CSP) device, and it does not require the conventional wire bonding, so the overall volume and size of the package structure of the optical apparatus is reduced. In addition, the multilayer film disposed on the light sensing device not only prevents the ambient light from being transmitted to the light sensing device but also reduces the overall volume and size of the package structure of the optical apparatus. Moreover, the design of the light barrier member not only reduces the overall volume and size of the package structure of the optical apparatus but also reduces the manufacture cost and the manufacture difficulty.

The objectives, technical details, features, and effects of the present invention will be better understood with regard to the detailed description of the embodiments below, with reference to the drawing.

DESCRIPTION OF THE PREFERRED EMBODIMENTS

Figure 1:
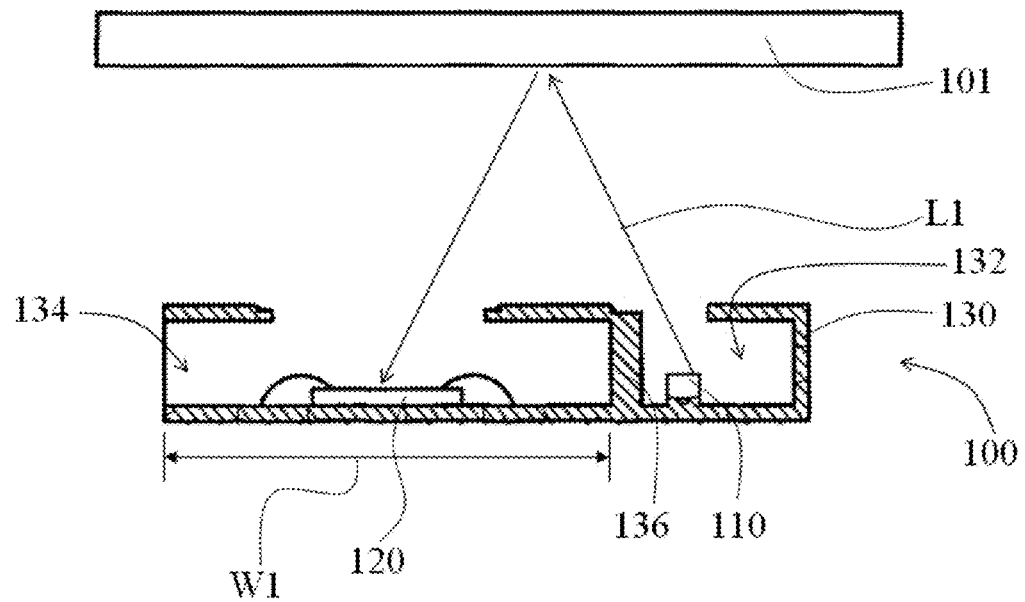
FIG. 1 shows a cross-sectional view of the package structure of a conventional optical proximity sensor.

The above and other technical details, features and effects of the invention will be will be better understood with regard to the detailed description of the embodiments below, with reference to the drawings. In the description, the words relate to directions such as "upper", "on", "above", etc. are used to illustrate relative orientations in the drawings and should not be considered as limiting in any way.

Figure 2:
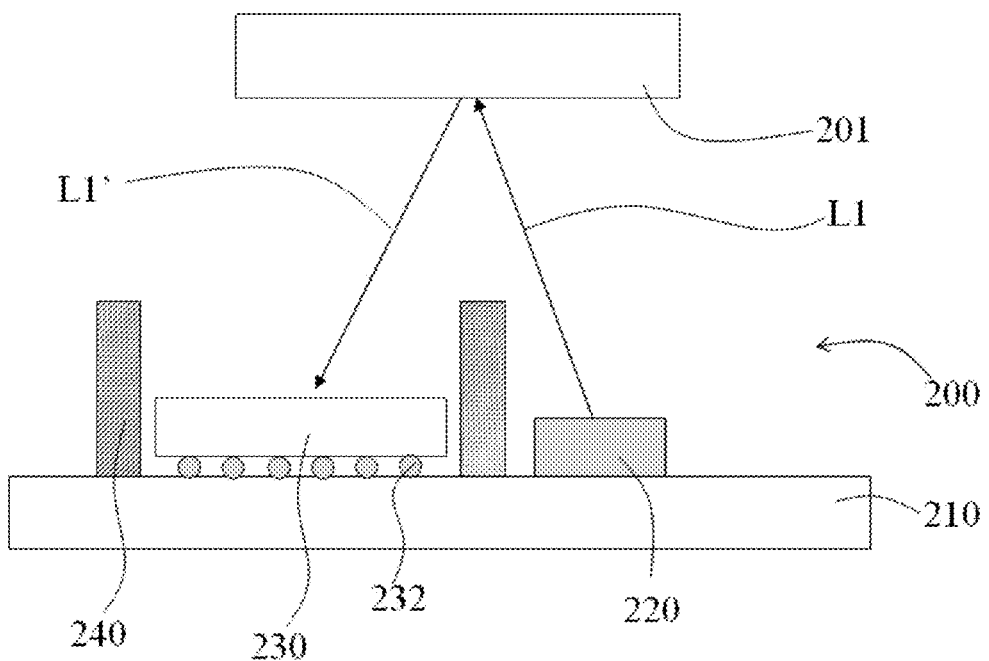
FIG. 2 shows a schematic view of a package structure of an optical apparatus according to an embodiment of the present invention.

FIG. 2 shows a schematic view of a package structure of an optical apparatus according to an embodiment of the present invention. The package structure of the optical apparatus 200 of this embodiment is illustrated by taking an optical proximity sensor as an example. The package structure of the optical apparatus 200 comprises a substrate 210, alight emitting device 220, a light sensing device 230, and a light barrier member 240. The light emitting device 220 is disposed on the substrate 210 and electrically connected to the substrate 210. The light emitting device 220 is for emitting light including a light beam L1. In this embodiment, the light emitting device 220 can be a light emitting diode or a laser diode. Because the cost of a light emitting diode is cheaper than that of a laser diode, the light emitting device 220 of this embodiment uses a light emitting diode. However, this is only an example and the light emitting device 220 can be a laser diode instead, if the package structure of the optical apparatus 200 is for providing a longer operable distance and the cost of the laser diode is not an issue. In addition, to prevent the user from seeing the light emitted from the light emitting device 220, the light emitting device 220 is preferably but not limited to a light emitting device for emitting invisible light, such as an infrared light emitting device.

Moreover, if the light emitting device 220 is a light emitting diode, the light emitting device 220 can be electrically connected to the substrate 210 by a Surface Mounted Technology (SMT), in order to reduce or minimize the overall volume and size of the package structure of the optical apparatus 200. The substrate 210 can be a circuit board or a lead frame.

In the package structure of the optical apparatus 200, the light sensing device 230 is disposed on the substrate 210, for receiving the reflected light beam L1' reflected by an object 201. In a preferable embodiment, to reduce or minimize the overall volume and size of the package structure of the optical apparatus 200, the light sensing device 230 can be a chip scale package (CSP) device, wherein the CSP technology can result in a package having a size no greater than 1.2 times of the die. More specifically, in this embodiment, the CSP device means that the packaged light sensing device 230, which may be packaged in any methods, has a length which is no greater than 120% of the die, or an area which is no greater than 1.5 times of the die. In other words, the light sensing device 230 which is packaged by the CSP technology has a reduced size to be ⅒ to ¼ times the size of the conventionally packaged light sensing device 230, thus fitting the present product developing trend of light, thin, short and small.

In addition, the connection between the light sensing device 230 and the substrate 210 via the conventional wire bonding would make it not easy to reduce the overall package size, and in order to avoid such a drawback, the light sensing device 230 of this embodiment is electrically connected to the substrate 210 via one or more conductive materials 232. As shown in FIG. 2, the conductive materials 232 are provided between the light sensing device 230 and the substrate 210. In this embodiment, the conductive materials 232 can be tin balls.

Still referring to FIG. 2, if the light beam L1 emitted from the light emitting device 220 is directly received by the light sensing device 230, the optical apparatus would not operate accurately (e.g., not being able to judge whether there is an object approaching), and in order to avoid such a drawback, the light barrier member 240 is disposed around a periphery of the light sensing device 230. As shown in FIG. 2, the light barrier member 240 is disposed on the substrate 210 and physically connected to the substrate 210. Notably, because the light sensing device 230 is a CSP device which is electrically connected to the substrate 210 via conductive materials 232 and not by the conventional wire bonding, the distance between the light sensing device 230 and the light barrier member 240 is very small (it is not necessary to take into account the space required for the wire bonding), thus reducing the overall volume and size of the package structure of the optical apparatus 200.

Figure 3A:
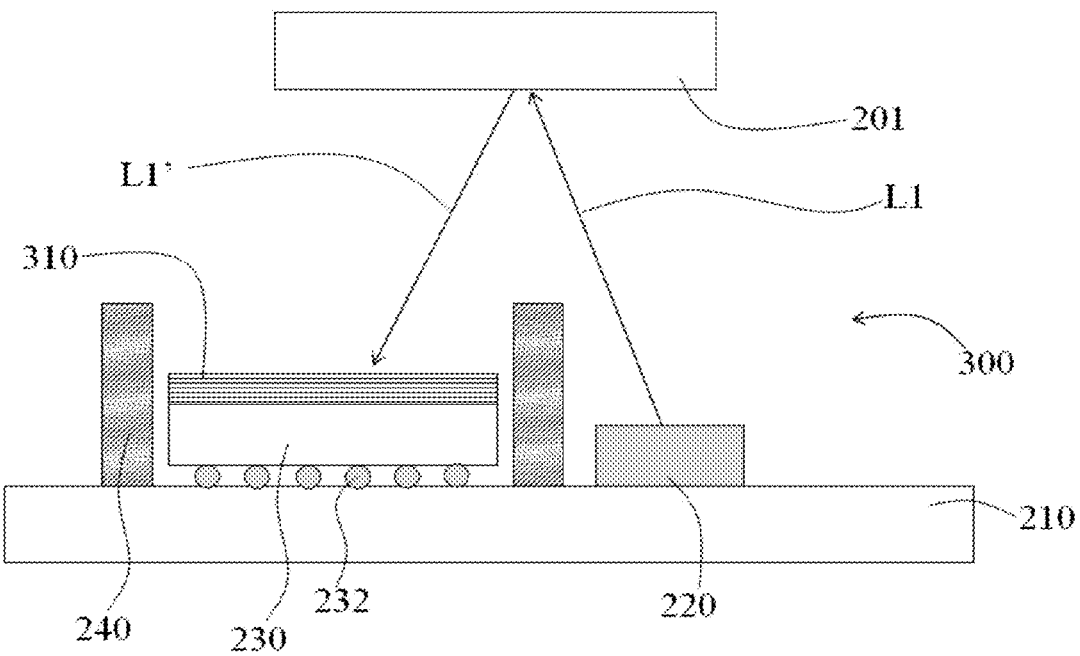
FIG. 3A shows a schematic view of a package structure of an optical apparatus according to another embodiment of the present invention.

FIG. 3A shows a schematic view of a package structure of an optical apparatus according to another embodiment of the present invention. Please refer to both FIG. 2 and FIG. 3A. The package structure of the optical apparatus 300 of this embodiment is substantially the same as the above-mentioned package structure of the optical apparatus 200, but is different in that the package structure of the optical apparatus 300 further comprises a multilayer film 310. The multilayer film 310 is disposed on or above the light sensing device 230. At least a portion of the reflected light beam L1' reflected by the object 201 can pass through the multilayer film 310 to be received by the light sensing device 230.

Figure 3B:
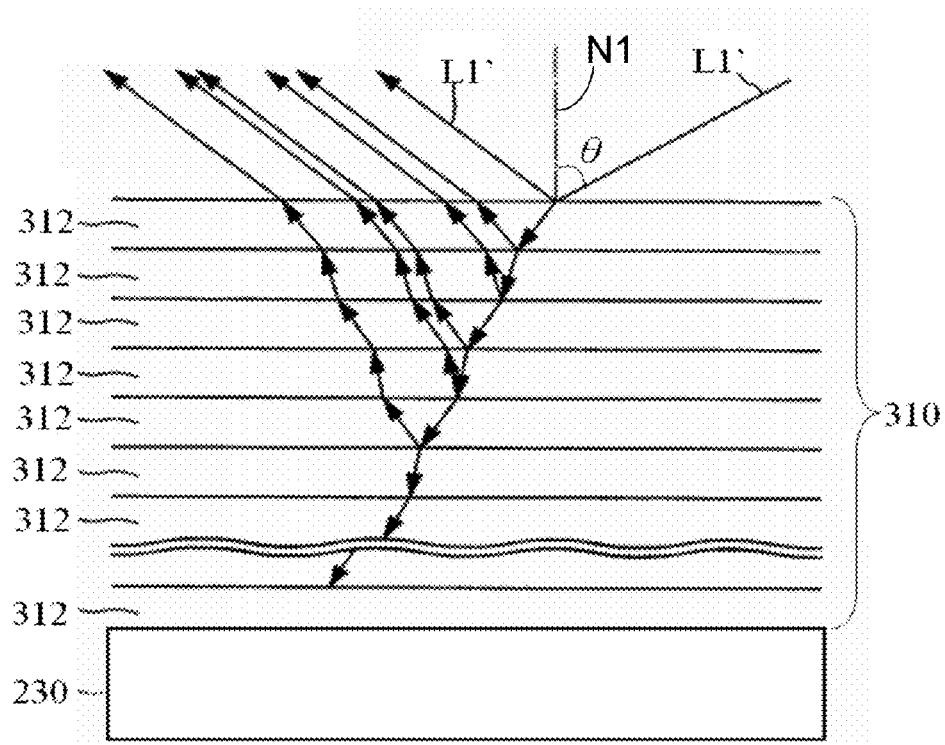
FIG. 3B shows an enlarged view of a part of the package structure of the optical apparatus of FIG. 3A.

Referring to FIG. 3B, which shows an enlarged view of a part of the package structure of the optical apparatus of FIG. 3A, the multilayer film 310 is made of stacked film layers 312 with different refractive indexes to filter out the light of undesired wavelengths, such that the light beam L1' within a specific wavelength range can pass through the multilayer film 310. The wavelength of the incident light beam which can pass through the stacked film layers 312 is related to the incident angle θ from the normal N1. For example, if the stacked film layers 312 of the multilayer film 310 is designed for the light beam with a wavelength of 680 nm to pass through, then the incident light beam L1' with a wavelength of 680 nm will pass through the multilayer film 310 at an incident angle θ of zero degree. If the incident light beam deviates from the normal N1 (namely, the incident angle θ is greater than zero degree), the incident light beam L1' with other wavelength (e.g., 670 nm to 690 nm wavelength) will pass through the multilayer film 310 to be received by the light sensing device 230. In other words, the multilayer film 310 of this embodiment can be used as an IR pass filter.

More specifically, if the portion of the reflected light beam L1' reflected by the object 201 enters the multilayer film 310 with an incident angle θ that is smaller than a predetermined angle, the reflected light beam L1' can pass through the multilayer film 310 to be received by the light sensing device 230, as shown in FIG. 3B. The smaller the incident angle θ of the light beam L1' having the specific wavelength is when it enters the multilayer film 310 (the closer the light beam L1' to the normal N1), the easier the light beam L1' having the specific wavelength passes through the multilayer film 310 to be received by the light sensing device 230. On the contrary, the greater the incident angle θ of the light beam L1' having the specific wavelength is when it enters the multilayer film 310 (the farther the light beam L1' from the normal N1), the more difficult light beam L1' having the specific wavelength passes through the multilayer film 310, and less likely to be received by the light sensing device 230. Notably, the light beam L1 emitted from the light emitting device 220 may have a specific wavelength range, and the light barrier member 240 with an appropriate height would restrain the incident angle θ of the light beam L1' when it enters the multilayer film 310, such that the ambient light having undesired wavelengths are filtered out, and the light beam L1' within a specific wavelength range passes through the multilayer film 310 to be received by the light sensing device 230. In one embodiment, the height of the light barrier member 240 is larger than that of the light emitting device 220 and that of the light sensing device 230, and is smaller than 5 mm.

In view of the above, the package structure of the optical apparatus 300 of this embodiment not only has the same advantages as the above-mentioned package structure of the optical apparatus 200, but also prevents undesired ambient light from being transmitted to the light sensing device 230 by means of the multilayer film 310, so that the optical sensing performance of the optical apparatus is further enhanced.

Figure 4:
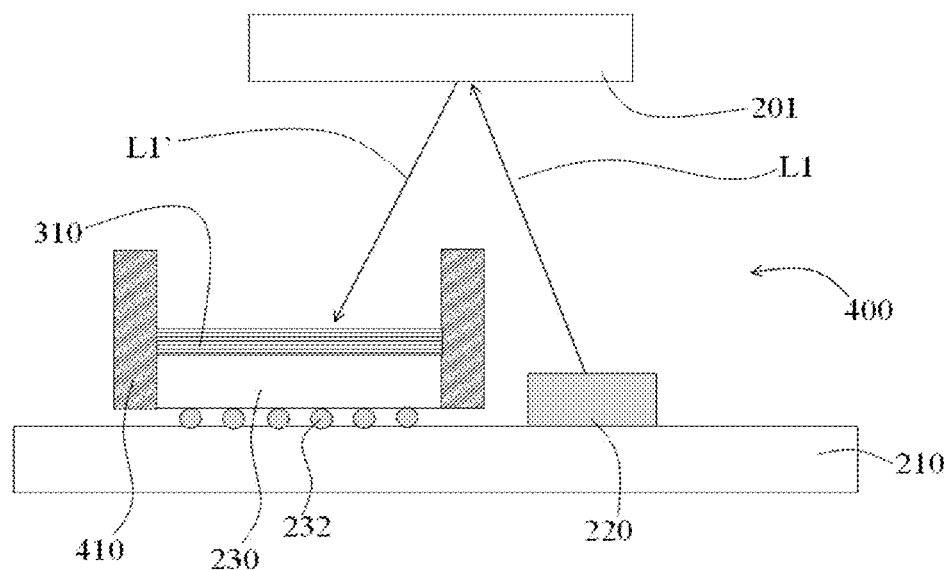
FIG. 4 shows a schematic view of a package structure of an optical apparatus according to yet another embodiment of the present invention.

FIG. 4 shows a schematic view of a package structure of an optical apparatus according to yet another embodiment of the present invention. Please refer to both FIG. 3A and FIG. 4. The package structure of the optical apparatus 400 of this embodiment is substantially the same as the above-mentioned package structure of the optical apparatus 300, but is different in that: the light barrier member 410 is physically connected to the light sensing device 230, but is not physically connected to the substrate 210. In this embodiment, the light barrier member 410 is disposed at the periphery of the light sensing device 230 and physically connected to the light sensing device 230. As a result, it is not necessary to dispose the above-mentioned light barrier member 240 on the substrate 210. That is, if the light sensing device 230 is mounted on the substrate 210, the light barrier member 240 is also mounted on the substrate 210 together with the light sensing device 230. Hence, the overall volume and size of the package structure of the optical apparatus 400 is further reduced.

In view of the above, the package structure of the optical apparatus 400 of this embodiment not only has the same advantages as the above-mentioned package structures of the optical apparatus 200 and 300, but also reduces its overall volume and size by physically connecting the light barrier member 410 to the light sensing device 230.

Figure 5:
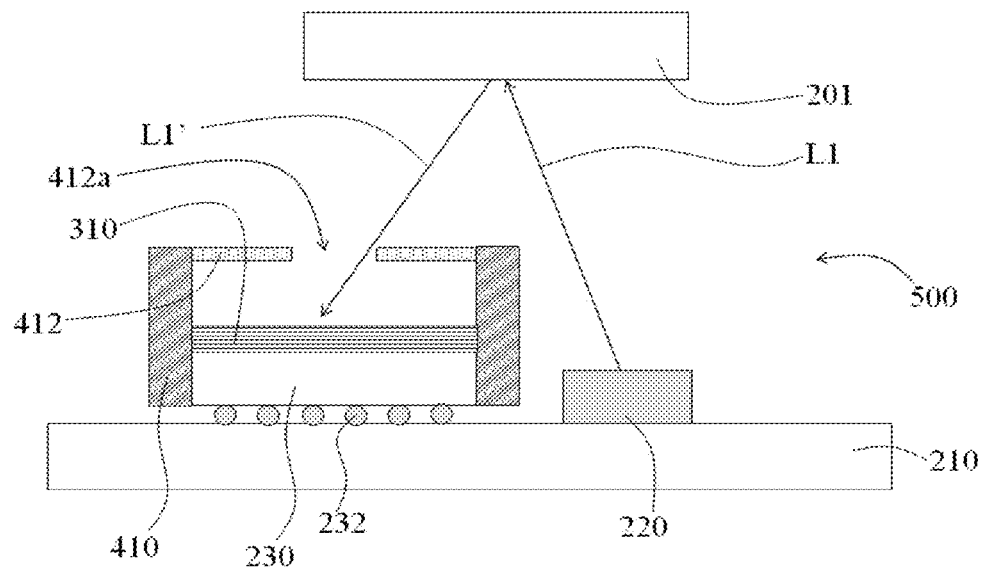
FIG. 5 shows a schematic view of a package structure of an optical apparatus according to still another embodiment of the present invention.

FIG. 5 shows a schematic view of a package structure of an optical apparatus according to still another embodiment of the present invention. Please refer to both FIG. 4 and FIG. 5. The package structure of the optical apparatus 500 of this embodiment is substantially the same as the above-mentioned package structure of the optical apparatus 400, but is different in that the light barrier member 410 includes a light blocking cover 412. The light blocking cover 412 is disposed on or above the light sensing device 230 and has an opening 412a that exposes a portion of the multilayer film 310. At least a portion of the reflected light beam L1' reflected by the object 201 can pass through the opening 412a to be received by the light sensing device 230. In this embodiment, the package structure of the optical apparatus 500 not only has the same advantages as the above-mentioned package structures of the optical apparatus 200, 300 and 400, but also effectively prevents the ambient light from being transmitted to the light sensing device 230 by means of the light blocking cover 412 which has an opening 412a above the light sensing device 230.

Figure 6:
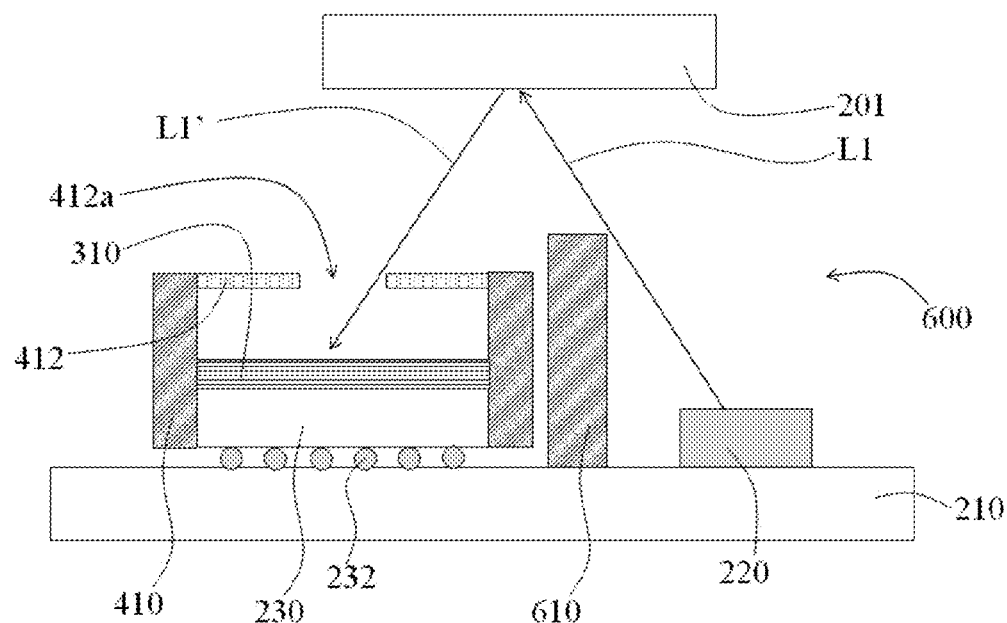
FIG. 6 shows a schematic view of a package structure of an optical apparatus according to still another embodiment of the present invention.

FIG. 6 shows a schematic view of a package structure of an optical apparatus according to still another embodiment of the present invention. Please refer to both FIG. 5 and FIG. 6. The package structure of the optical apparatus 600 of this embodiment is substantially the same as the above-mentioned package structure of the optical apparatus 500, but is different in that the package structure of the optical apparatus 600 further comprises a partition wall 610. The partition wall 610 is disposed on the substrate 210 and located between the light emitting device 220 and the light sensing device 230. The partition wall 610 is for preventing the light beam L1 emitted from the light emitting device 220 from being directly transmitted to the lateral side of the light sensing device 230. In addition, the partition wall 610 can more effectively prevent the ambient light from being received by the light sensing device 230. Besides the above, the package structure of the optical apparatus 600 of this embodiment also has the same advantages as the above-mentioned package structures of the optical apparatus 200, 300, 400 and 500, which are not redundantly repeated here.

Figure 7:
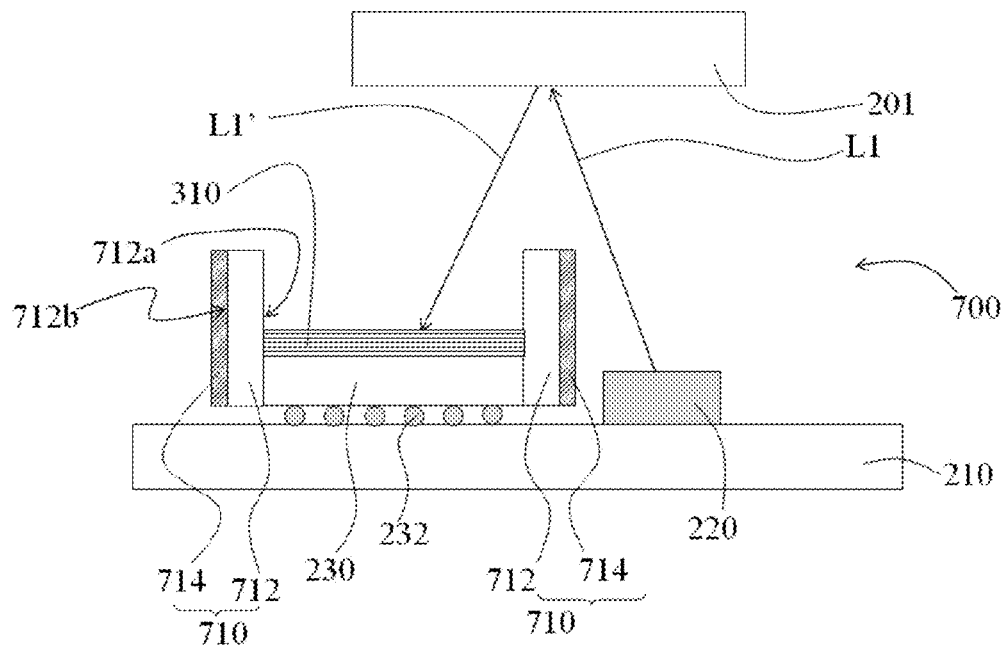
FIG. 7 shows a schematic view of a package structure of an optical apparatus according to still another embodiment of the present invention.

FIG. 7 shows a schematic view of a package structure of an optical apparatus according to still another embodiment of the present invention. Please refer to both FIG. 4 and FIG. 7. The package structure of the optical apparatus 700 of this embodiment is substantially the same as the above-mentioned package structure of the optical apparatus 400, but is different in that the light barrier member 710 of this embodiment includes a light transmissive layer 712 and a shielding layer 714. A side 712a of the light transmissive layer 712 is physically connected to the light sensing device 230. Another side 712b of the light transmissive layer 712 is physically connected to the shielding layer 714. In one embodiment, the shown structure with the light barrier member 710 can be formed by first forming the light transmissive layer 712 of FIG. 7 by a light transmissive material (such as a transparent plastic material) around the periphery of the light sensing device 230, and then forming the shielding layer 714 by coating or adhering a light shielding material (such as a black resin) on the outside 712b of the transmissive layer 712. Or in another embodiment, the light barrier member 710 as shown in FIG. 7 can be first manufactured, and then the light barrier member 710 is connected (e.g., by adhesion) to the light sensing device 230. The above-mentioned methods for forming the shown structure with the light barrier member 710 are only illustrative examples, but not for limiting the scope of the present invention. The structure can be manufactured in any way. The package structure of the optical apparatus 700 of this embodiment has the same advantages as the above-mentioned package structures of the optical apparatus 200, 300 and 400, which are not redundantly repeated here.

Figure 8:
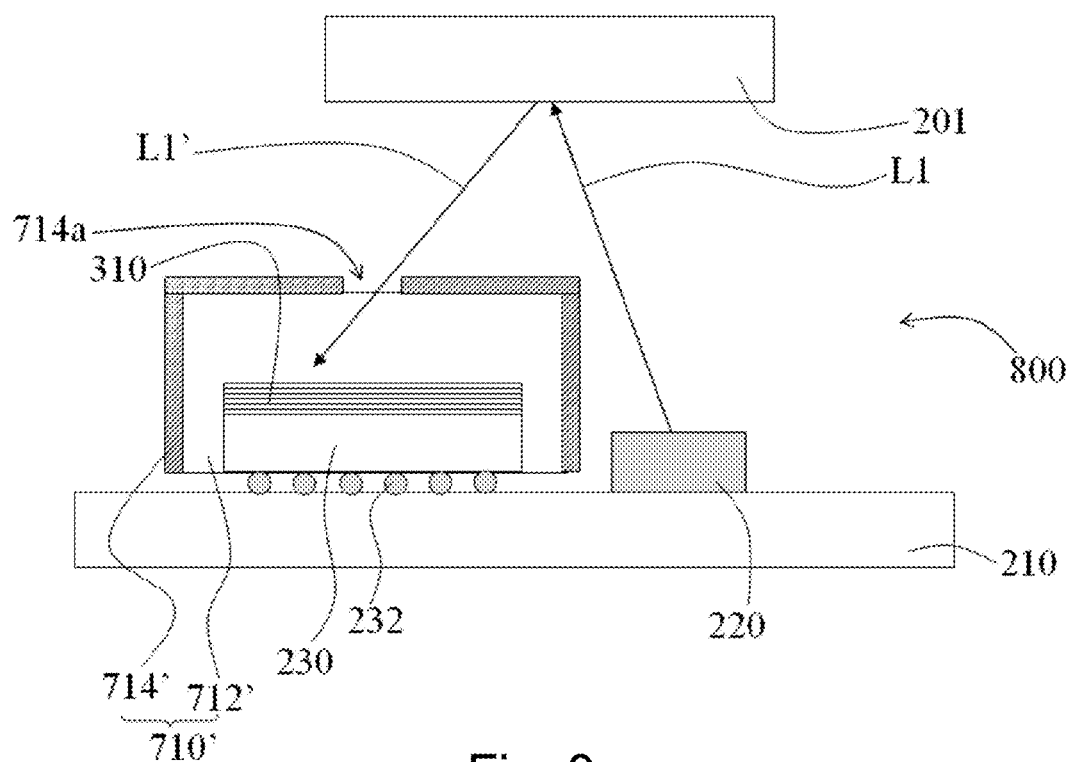
FIG. 8 shows a schematic view of a package structure of an optical apparatus according to still another embodiment of the present invention.

FIG. 8 shows a schematic view of a package structure of an optical apparatus according to still another embodiment of the present invention. Please refer to both FIG. 7 and FIG. 8. The package structure of the optical apparatus 800 of this embodiment is substantially the same as the above-mentioned package structure of the optical apparatus 700, but is different in that the light transmissive layer 712' covers the upper surface of the light sensing device 230. In addition, the shielding layer 714' has an opening 714a which exposes a portion of the transmissive layer 712'. At least a portion of the reflected light beam L1' reflected by the object 201 can pass through the opening 714a to be received by the light sensing device 230, as shown in FIG. 8. In this embodiment, for example, the shown structure can be formed by first forming the light transmissive layer 712' of FIG. 8 by a light transmissive material (such as a transparent plastic material) on and around the periphery of the light sensing device 230, and then forming the shielding layer 714' by coating or adhering a light shielding material (such as a black resin) on the outside of the transmissive layer 712'. Similarly, the package structure of the optical apparatus 800 of this embodiment has the same advantages as the above-mentioned package structure of the optical apparatus 200, 300 and 400, which are not redundantly repeated here.

It is noteworthy that the overall size of the package structures of the optical apparatus 200 to 800, as compared with the overall size of the conventional package structure of the optical apparatus 100, is greatly reduced. The distance W1 between the light emitting device 220 and the light sensing device 230 at least can be reduced to a range between 0.1 mm to 3 mm.

In view of the above, the package structure of the optical apparatus of the present invention at least has the following advantages. The light sensing device is a chip scale package (CSP) device, and it does not require the conventional wire bonding, so the overall volume and size of the package structure of the optical apparatus is reduced. In addition, the multilayer film disposed on the light sensing device not only prevents the ambient light from being transmitted to the light sensing device but also reduces the overall volume and size of the package structure of the optical apparatus. Moreover, the design of the light barrier member not only reduces the overall volume and size of the package structure of the optical apparatus but also reduces the manufacture cost and the manufacture difficulty.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. A package structure of an optical apparatus, comprising:
    a substrate;
    a light emitting device for emitting light, the light emitting device being disposed on the substrate;
    a light sensing device disposed on the substrate, for receiving light reflected by an object, wherein the light sensing device is a chip scale package (CSP) device which is electrically connected to the substrate via one or more conductive materials but not via wire bonding, wherein the one or more conductive materials are located between the light sensing device and the substrate and located inside an area of the light sensing device as viewed from a direction normal to the substrate; and
    a light barrier member, which is disposed around a periphery of the light sensing device, wherein the light barrier member is physically connected to the light sensing device and is connected to the substrate through the light sensing device and the one or more conductive materials, but is not connected to the substrate by a connection bypassing the light sensing device,
    wherein the light barrier member includes a light transmissive layer and a shielding layer, a side of the transmissive layer being physically connected to the light sensing device, another side of the transmissive layer being physically connected to the shielding layer,
    wherein the shielding layer is away from the substrate by a distance.

2. The package structure of the optical apparatus according to claim 1, further comprising:
    a multilayer film disposed on or above the light sensing device, wherein at least a portion of the light reflected by the object passes through the multilayer film to be received by the light sensing device.

3. The package structure of the optical apparatus according to claim 2, wherein the light barrier member further includes a light blocking cover disposed on or above the light sensing device and having an opening, and the portion of the light reflected by the object passes through the opening to be received by the light sensing device.

4. The package structure of the optical apparatus according to claim 3, wherein the opening exposes a portion of the multilayer film.

5. The package structure of the optical apparatus according to claim 3, further comprising:
    a partition wall, which is disposed on the substrate and located between the light emitting device and the light sensing device.

6. The package structure of the optical apparatus according to claim 2, wherein the portion of the light reflected by the object that passes through the multilayer film to be received by the light sensing device enters the multilayer film with an incident angle smaller than a predetermined angle.

7. The package structure of the optical apparatus according to claim 1, wherein the light transmissive layer covers an upper surface of the light sensing device, and the shielding layer has an opening which exposes a portion of the light transmissive layer, the portion of the light reflected by the object passes through the opening to be received by the light sensing device.

8. The package structure of the optical apparatus according to claim 1, wherein the light emitting device is a light emitting device emitting invisible light and the light sensing device is a light sensing device sensing invisible light.

9. The package structure of the optical apparatus according to claim 1, wherein a distance between the light emitting device and the light sensing device is in a range between 0.1 mm and 3 mm.

\* \* \* \* \*